(12) United States Patent
Myers et al.

(10) Patent No.: US 7,105,382 B2
(45) Date of Patent: Sep. 12, 2006

(54) SELF-ALIGNED ELECTRODES CONTAINED WITHIN THE TRENCHES OF AN ELECTROOSMOTIC PUMP

(75) Inventors: Alan M. Myers, Menlo Park, CA (US); Sarah E. Kim, Portland, OR (US); R. Scott List, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 27 days.

(21) Appl. No.: 10/721,441

(22) Filed: Nov. 24, 2003

(65) Prior Publication Data

US 2005/0112816 A1    May 26, 2005

(51) Int. Cl.
    *H01L 21/50* (2006.01)
(52) U.S. Cl. ............... 438/122; 438/106; 257/E23.098; 257/E25.013
(58) Field of Classification Search ......... 438/106–127
    See application file for complete search history.

(56) References Cited

U.S. PATENT DOCUMENTS

| | | | | |
|---|---|---|---|---|
| 5,246,879 | A * | 9/1993 | Hsu et al. ................ | 438/386 |
| 5,933,748 | A * | 8/1999 | Chou et al. ............... | 438/431 |
| 6,007,309 | A * | 12/1999 | Hartley .................... | 417/322 |
| 6,582,987 | B1 * | 6/2003 | Jun et al. ................. | 438/49 |
| 6,861,274 | B1 * | 3/2005 | List et al. ................ | 438/42 |
| 6,919,231 | B1 * | 7/2005 | Ramanathan et al. ....... | 438/122 |
| 2003/0003619 | A1 * | 1/2003 | Winer et al. .............. | 438/50 |
| 2003/0129798 | A1 * | 7/2003 | Saenger et al. ........... | 438/243 |
| 2003/0164231 | A1 * | 9/2003 | Goodson et al. ........ | 165/104.11 |
| 2004/0241980 | A1 * | 12/2004 | Yamazaki et al. .......... | 438/632 |
| 2005/0062150 | A1 * | 3/2005 | Kim et al. ................. | 257/714 |
| 2005/0117299 | A1 * | 6/2005 | Prasher et al. ............ | 361/699 |

OTHER PUBLICATIONS

Joo et al, "Fabrication of Monolithic Microchannels for IC Chip Cooling" 1995 IEEE pp. 362-367.*
Laser, Daniel J., Electrokinetics and Electroosmotic Flow, The Electric Double Layer and Electrokinetic Effects, http://www.stanford.edu/~dlaser/electrokinetics_and_eof/electrokinetics_and_eof.htm, research.htm, Jun. 2, 2003, 2 pages.
Laser, Daniel J., Silicon Electroosmotic Micropumps: Design and Theory of Operation, Prototypes, Performance, and Applications, Theory of Operation, http://www.stanford.edu/~dlaser/silicon_eo_pumps/silicon_eo_pumps.htm, Jun. 2, 2003, 4 pages.
Laser, Daniel J., Silicon Electroosmotic Micropumps: Design and Theory of Operation, Prototypes, Performance, and Applications, Prototype Silicon Electroosmotic Micropumps, http://www.stanford.edu/~dlaser/si_eopumps_perf/si_eopumps_perf.html, Nov. 24, 2003, 3 pages.

* cited by examiner

*Primary Examiner*—Savitri Mulpuri
(74) *Attorney, Agent, or Firm*—Blakely, Sokoloff, Taylor & Zaffman LLP

(57) ABSTRACT

A device where the electrodes of an electroosmotic pump are located directly in the flow-producing region of the electroosmotic pump is described as well as methods of forming such a device. Placing the electrodes of an electroosmotic pump directly in the flow-producing region of the electroosmotic pump may increase the flow rate of a cooling fluid that is pumped through the pump. The cooling fluid may then remove a greater amount of heat from the substrate over which it is flowed. The substrate may be the non-device side of a die or a thermal management chip that is placed in direct contact with the non-device side of a die. In these instances the electroosmotic pump may be part of a microelectronic package containing the die or the thermal management chip.

16 Claims, 11 Drawing Sheets

TOP VIEW         SIDE VIEW

TOP VIEW         SIDE VIEW

SELF-ALIGNED ELECTRODES CONTAINED WITHIN THE TRENCHES OF AN ELECTROOSMOTIC PUMP

BACKGROUND OF THE INVENTION

1. Field of the Invention

The present invention relates to the field of removing the heat produced by devices on an integrated circuit away from the devices, and more particularly to the use of electroosmotic pumps to circulate cooling fluid to remove the heat from integrated circuits.

2. Discussion of Related Art

The dimensions of devices are shrinking in the integrated circuit (IC) industry while at the same time the number of devices and their respective operations is increasing. All of these factors add to an increase in the heat production of semiconductor devices and the formation of "hot spots", or areas of intense heat, that develop on an IC during operation. Therefore, effective heat dissipation has become critical in order to further scale down devices and increase their numbers and operations.

Various techniques can typically be used to dissipate the heat generated by the operations of the devices on an IC die. One such technique is the use of a heat sink. As illustrated by the cross sectional view in FIG. 1, a heat spreader 110 is a cap formed of a heat conductive material, such as copper, aluminum, or a ceramic, that is placed above and around an IC die 120 after processing. The heat spreader is not in direct contact with the devices on the IC die because they are pointed down and away from the heat spreader. Also, the heat spreader is not in direct contact with the silicon substrate on which the devices of the IC die are formed because a first thermal interface material (TIM) 130 is placed between the backside of the IC die 110 and the heat spreader 120. A TIM can be a thermally conductive gel, solder, or grease. A heat sink 140 is typically also used for heat dissipation. The heat sink 140 typically has fins 145 that increase the surface area of the sink and thus further dissipate heat. Between the heat spreader 120 and the heat sink 140 a second TIM 150 is placed.

The heat produced by an IC die may exceed the heat dissipation capacity of most passive heat sinks and heat spreaders such as the ones described above. Non-passive heat dissipation devices are being employed to further dissipate heat. One such device is a small cooling fan that can be part of the microelectronic package housing the IC die and the heat sink. Cooling fans can only dissipate a limited amount of heat without becoming unduly large and typically dissipate heat only from the microelectronic package and not from the IC die where the heat is produced. Fans also produce unwanted vibrations.

Another non-passive cooling technique is a water-cooling system. Typically, a water-cooling system transfers heat from the heat sink and heat spreader within the microelectronic package. The hot water formed by this technique is pumped away and continually replaced with cooler water to dissipate heat. The water can run through a series of pipes around the heat sink or through the heat sink. Again, this technique can only dissipate a limited amount of heat before becoming bulky and mainly removes heat from the microelectronic package and not the IC die itself.

To avoid the use of bulky passive and non-passive cooling devices that are limited in their ability to dissipate heat, the industry has turned to the use of cooling devices that can be formed in direct contact with the die within the microelectronic package. One such cooling device is a cooling fluid system formed on the backside of a die or on a thermal management chip that is in direct contact with the backside of a die. An example of such a cooling fluid system is illustrated in FIG. 2. This cooling fluid system utilizes an electroosmotic pump 210 to move water from one side of the substrate 200 to the other. An electroosmotic pump 210 operates through the use of an anode 220 and a cathode 230 formed on either side of a row of trenches 240. The electrical field created between the anode 220 and the cathode 230 will attract ions in a cooling fluid that are present as a result of what is known as an "electrical double layer." An example of how a double layer forms is when the trenches fabricated in silicon are lined with a thermal oxide. The bonds of the surface of the oxide are terminated by hydrogen ions. When the oxide is in contact with a liquid, one example being water, the hydrogen will release from but stay close to the surface. The hydrogen ions are protons and the liquid in the trenches now contains an excess of positive ions as compared to negative ions. This layer of protons which is close to the trench wall is called the electrical double layer. Hence, the excess positive ions in the cooling fluid will move under the applied electrical field. Because of the viscous drag this creates, the moving excess positive ions pull the surrounding fluid to generate a motion in the bulk fluid. By this mechanism the cooling liquid 250 is pulled though the row of trenches 240 that are the flow-producing region of the pump, and therefore from one side of the substrate to the other to cool the area by continuously pulling in cooling liquid 250 having a lower temperature and pushing out the cooling liquid 250 that has absorbed heat. Typically, the pump generates flow and pressure. After leaving the pump, the fluid moves through channels either etched in the back of the silicon die, in a piece of silicon, or in some other material such as copper which is in contact with the back of the die. The back of the die may be thinned in order to reduce the thermal resistance between the heat generating region of the IC and the back of the die.

An electroosmotic pump 210 will pump the cooling liquid 250 at a faster rate depending on how close the electrodes (anode 220 and cathode 230) are to one another and how close the electrodes 220 and 230 are to the row of trenches 240 that is the flow-producing region of the pump. In the prior art electroosmotic pump 210 of FIG. 2, the electrodes 220 and 230 are bulky wires that cannot be placed in close proximity to the row of trenches 240. For example, the trench length may be on the order of 10 um to 100 um while the electrode wires are on the order of 1 mm apart. The strength of the electric field in the flow producing area of the row of trenches 240 is thus limited by the position of the electrodes 220 and 230 and will not be uniform along the entire depth of the trenches. As a result, the flow rate and cooling ability of the electroosmotic pump is also limited.

BRIEF DESCRIPTION OF THE DRAWINGS

FIG. 3b is an illustration of an overhead view of the electroosmotic pump illustrated in FIG. 3a.

DETAILED DESCRIPTION OF THE PRESENT INVENTION

Described herein are methods and devices employing an electroosmotic pump to pump cooling fluid. In the following description numerous specific details are set forth. One of ordinary skill in the art, however, will appreciate that these specific details are not necessary to practice embodiments of the invention. While certain exemplary embodiments of the invention are described and shown in the accompanying drawings, it is to be understood that such embodiments are merely illustrative and not restrictive of the current invention, and that this invention is not restricted to the specific constructions and arrangements shown and described because modifications may occur to those ordinarily skilled in the art. In other instances, well known semiconductor fabrication processes, techniques, materials, equipment, etc., have not been set forth in particular detail in order to not unnecessarily obscure embodiments of the present invention.

A device where the electrodes of an electroosmotic pump are located directly in the flow-producing region of the electroosmotic pump is described as well as methods of forming such a device. Placing the electrodes of an electroosmotic pump directly in the flow-producing region of the electroosmotic pump may increase the flow rate of a cooling fluid that is pumped through the pump. The cooling fluid may then remove a greater amount of heat from the substrate over which it is flowed. The substrate may be the non-device side of a die or a thermal management chip that is placed in direct contact with the non-device side of a die. In these instances the electroosmotic pump may be part of a microelectronic package containing the die or the thermal management chip.

Figure 1:
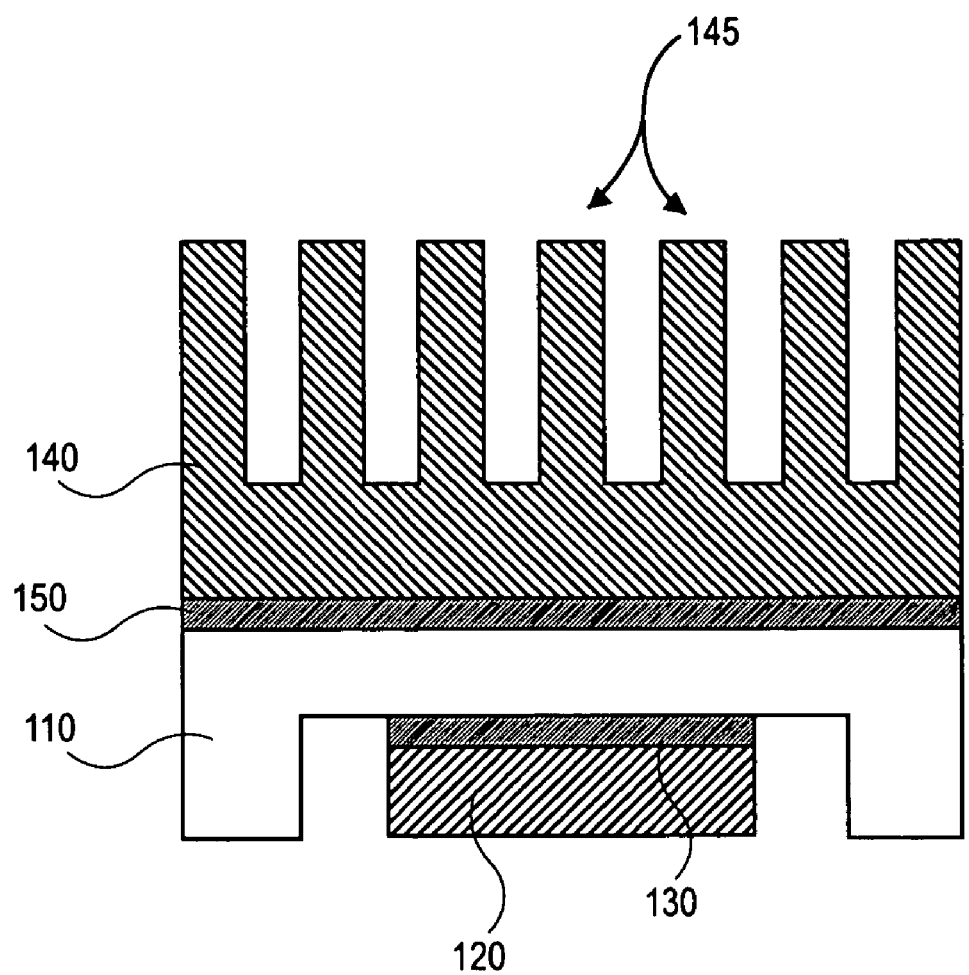
FIG. 1 is an illustration of a cross-sectional view of a prior art microelectronic package including a heat sink and heat spreader.
Figure 2:
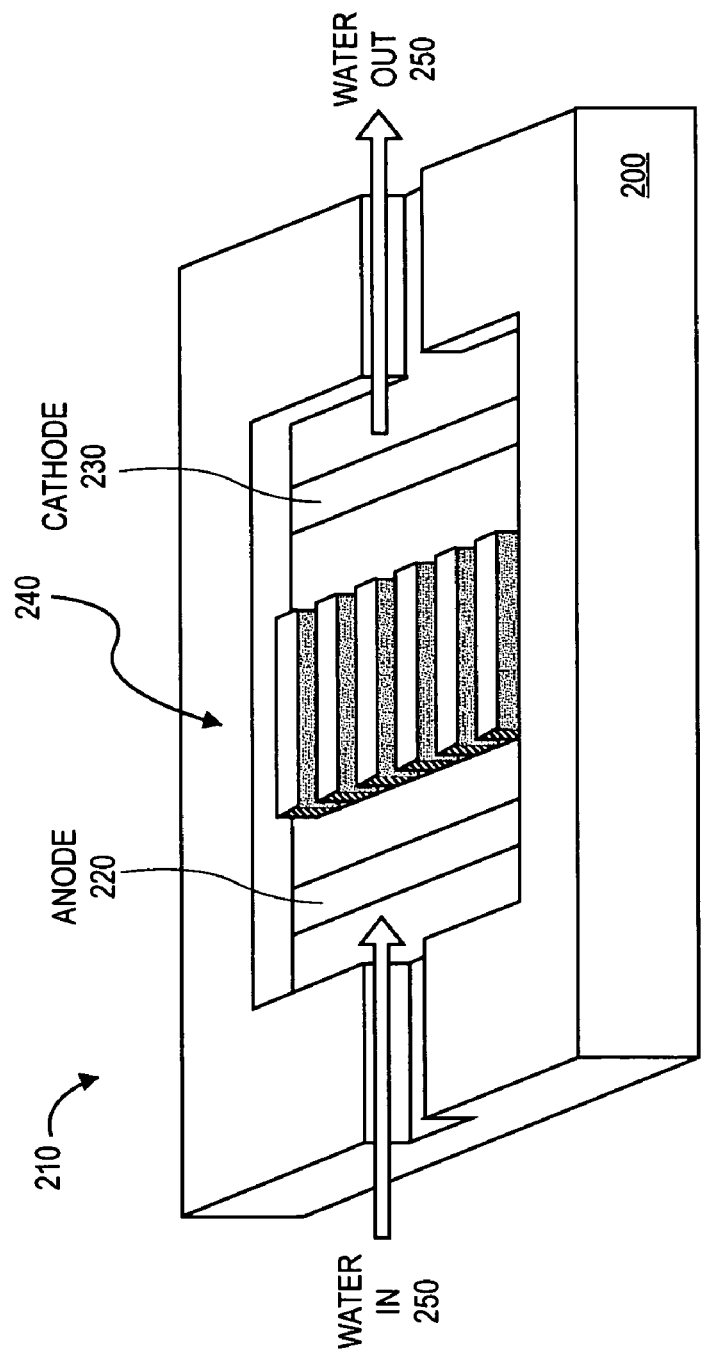
FIG. 2 is an illustration of a three-dimensional view of a prior art electroosmotic pump.
Figure 3A:
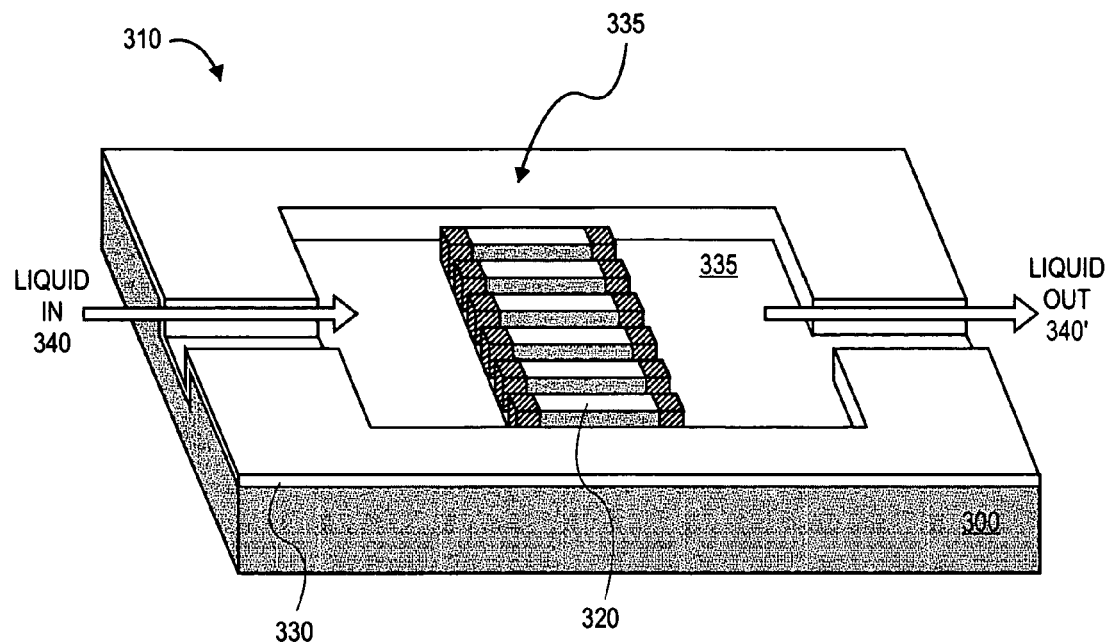
FIG. 3a is an illustration of a three-dimensional view of an electroosmotic pump having electrodes formed over trenches.
Figure 3B:
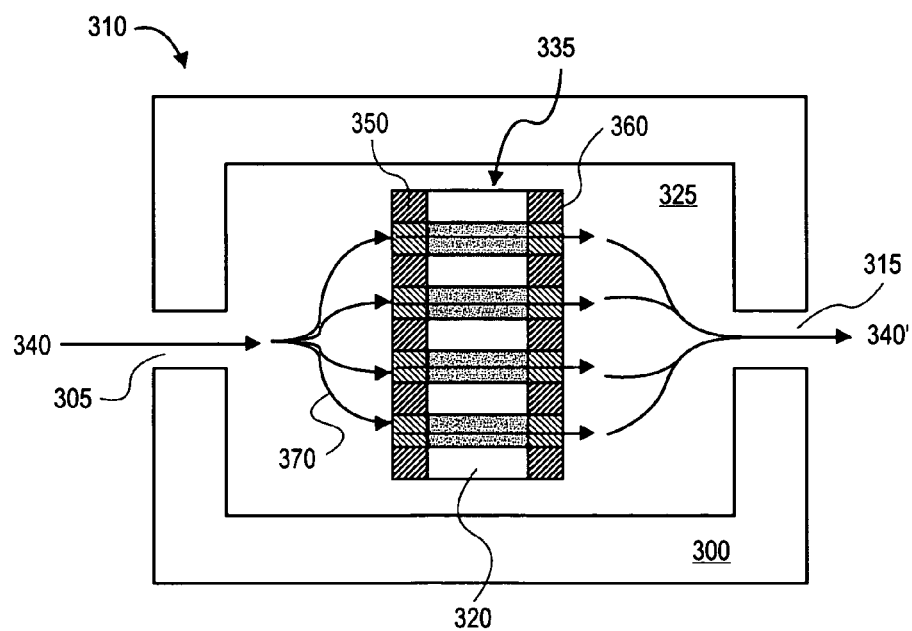

FIG. 3a illustrates a cross-sectional view of an electroosmotic pump 310 formed on a substrate 300, and FIG. 3b illustrates an overhead view of the same electroosmotic pump. The substrate 300 may be a semiconductor material such as silicon or a material such as glass or plastic. In one embodiment the substrate 300 may be the backside of a silicon die on which active semiconductor devices (not illustrated) may be formed on the frontside. In an alternate embodiment the substrate 300 may be a silicon thermal management chip that may be placed in contact with a wafer or die on which semiconductor devices have been formed. In a second alternate embodiment, the substrate 300 may be a silicon chip that is not in contact with a wafer or die on which semiconductor devices have been formed. The electroosmotic pump 310 may be a series of trenches 320 that may be in parallel with one another in a row 335, as illustrated in FIGS. 3a and 3b. The trenches 320 may be separated from one another by a distance in the approximate range of 5 um to 50 um. The length of the trenches 320 may be in the approximate range of 10 um and 500 um, the width of the trenches may be in the approximate range of 0.1 um and 5.0 um. The height of the trenches may be in the approximate range of 5 um and 300 um, and more particularly in the approximate range of 50 um and 100 um. In an embodiment, the trenches may also have a high aspect ratio of height to width in the approximate range of 10:1 to 100:1. Generally, the higher the aspect ratio of the trenches 320, the greater the flow of the cooling liquid 340. This is because what one desires for high flow is a large trench cross sectional area and a high electric field. A large trench cross-sectional area provides more wall areas on which an electrical double layer may form, thereby increasing the ions available to create flow of the cooling liquid. High pressure (at least 0.5 atm) may be used to move the fluid through the entire cooling system. High pressure is obtained when the trench walls are close together. Thus, one wants trenches that are short in length to create a high field, narrow in width to produce a high pressure, and very deep to create a large cross-sectional area.

As illustrated by the top view of the electroosmotic pump 310 in FIG. 3b, the trenches 320 of the electroosmotic pump may be within a flow region 325. The cooling liquid 340 may flow into the flow region 325 at a first opening 305 and flow out of the flow region 325 at a second opening 315. The cooling liquid 340 may be water or any other type of fluid that can absorb heat and still form an electrical double layer. In one embodiment, a liner layer 330 is formed over the substrate 300 to prevent current leakage through the electrically conductive substrate 300 that results from the electric field created in the cooling liquid 340. The liner layer 330 provides electrical insulation over the substrate 300. Without the liner layer 330, the electric current that arises from the presence of the electric field between the first electrode 350 and the second electrode 360 may flow through the substrate 300 and short out the pump. The liner layer 330 may have a thickness of between 0.1 microns and 2.0 microns. The liner layer 330 may be any material that provides insulation but also promotes the formation of an electrical double layer within the cooling liquid 340, such as silicon nitride, silicon oxide, or a combination of silicon oxide over silicon nitride.

An electrical double layer may form when the trenches fabricated in silicon are lined with a liner layer 330 such as those described above. The bonds of the surface of the liner layer 330 may be terminated by hydrogen ions. When the liner layer 330 is in contact with a cooling liquid 340, such as water, the hydrogen ions will release from the surface of the liner layer 330, but stay close to the surface of the liner layer 330. The hydrogen ions are protons and the liquid in the trenches now contains an excess of positive ions as compared to negative ions. This layer of protons that is close to the liner layer 330 within the trenches 320 is called the electrical double layer. Hence, the excess positive ions in the cooling fluid will move under the influence of the electrical field applied to the electrodes 350 and 360. Because of the viscous drag this creates, the moving excess positive ions pull the surrounding fluid to generate a motion in the bulk fluid. By this mechanism the cooling liquid 340 may be pulled though the trenches 320 that are the flow-producing region of the electroosmotic pump 310. The pump formed in the manner described above, generates flow and pressure.

Within the trenches 320 and the liner layer 330 a first electrode 350 and a second electrode 360 may be formed. The electrodes 350 and 360 are formed over the contours of the trenches 320, the contours being the trench walls and the trench bottom. The electrodes 350 and 360 may run the length of the row 335 and each have a width in the approximate range of 1 um to 500 um, and more particularly in the approximate range of 10 um and 50 um. The electrodes 350 and 360 may be at the edges of the trenches 320, as illustrated in FIGS. 3a and 3b, or the electrodes 350 and 360 may be formed closer to one another some distance from the edges of the trenches 320. The first electrode 350 may be an anode and the second electrode 360 may be a cathode. The electrodes 350 and 360 are formed from a conductive material. The conductive material may be graphite or a metal, such as platinum. The electrodes 350 and 360 may be attached to electrical leads (not shown) that may contact the electrodes 350 and 360, from above the electrodes 350 and 360 or from below the electrodes 350 and 360 through the substrate 300.

In order to generate maximum flow and pressure of the cooling liquid 340, the electric field may be generated along the direction of the trench. To do this the first electrode 350 and the second electrode 360 may be parallel to one another and aligned at a 90 degree angle to the length of the trenches 320, as illustrated in FIG. 3a, in order to create an electric field within the trenches 320. The flow generated in each of the trenches 320 is directly proportional to the electric field strength, and the electric field strength relies on how close the electrodes 350 and 360 are to one another and how well aligned they are at a 90 degree angle to the trenches 320. Placing the electrodes 350 and 360 close to one another over the trenches 320 and aligning the electrodes 350 and 360 with the trenches 320 may further create a uniform and high electric field along the entire depth of the trenches 320.

As illustrated in FIG. 3b, the cooling liquid 340 may flow across the substrate through the trenches 320 by the creation of an electric field within the trenches 320 between the first electrode 350 and the second electrode 360. The electrical potential created between the first electrode 350 and the second electrode 360 will attract ions in the cooling liquid 340 that are present as a result of what is known as an "electrical double layer." Hence, any excess ions may result in a net ion motion in one direction under the applied electrical field. Because of the viscous drag this creates, the moving ions pull the surrounding cooling liquid 340 to move with the ions, and thus generate a motion in the bulk fluid. By this mechanism, the cooling liquid 340 is pulled though the trenches 320 that are the flow-producing region of the electroosmotic pump 310. The flow of the cooling liquid 340 is illustrated as the arrows 370. The pump typically is used to drive the fluid through microchannels and normally will not be located directly over "hot spots" of the wafer. This is especially true when two-phase cooling (i.e. the heat of a "hot spot" raises the temperature of the fluid to the point where steam is produced) because the pump cannot pump gas.

In one embodiment, an electric field is created by applying a voltage to the first electrode 350 (the anode) and by grounding the second electrode 360 (the cathode.) The voltage applied to the first electrode 350 may be in the approximate range of 5V to 500V, and more particularly in the approximate range of 20V to 100V. In one embodiment 5V is the minimum threshold voltage necessary to create flow of the cooling liquid 340 and 500V is the maximum voltage that may be used before the liner layer 330 breaks down. The flow rate of the cooling liquid 340 may be on the order of milliliters per second. In one embodiment the flow rate may be in the approximate range of 1 picoliters per second (pl/s) and 50 milliliters per second (ml/s), and more particularly in the approximate range of 1 ml/s and 50 ml/s. The flow rate of the cooling liquid 340 through the trenches 320 of the electroosmotic pump 310 may be maximized by minimizing the distance between the first electrode 350 and the second electrode 360. This is because the electric field equals the applied voltage divided by the distance between the electrodes. Therefore, the distance between the first electrode 350 and the second electrode 360 should be as small as possible. By increasing the flow rate by forming the electrodes 350 and 360 directly over the trenches rather than increasing voltage, power consumption may also be reduced.

A cover (not illustrated) may be placed over the substrate to contain and seal the cooling liquid within the electroosmotic pump so that the cooling liquid 340 may not interfere with the electrical properties of devices and materials around the area being cooled. The cover may be formed of a material such as silicon or glass. In an alternate embodiment the cover may not be necessary where the electroosmotic pump is formed on a thermal management chip that is placed in direct contact with the backside of a silicon die that may contain and seal in the cooling liquid 340. Although, in the thermal management chip embodiment, it may be valuable to form an insulator layer over the backside of the silicon die to protect the electrical field formed between the electrodes from electrical interference by the semiconductor substrate.

Figure 3C:
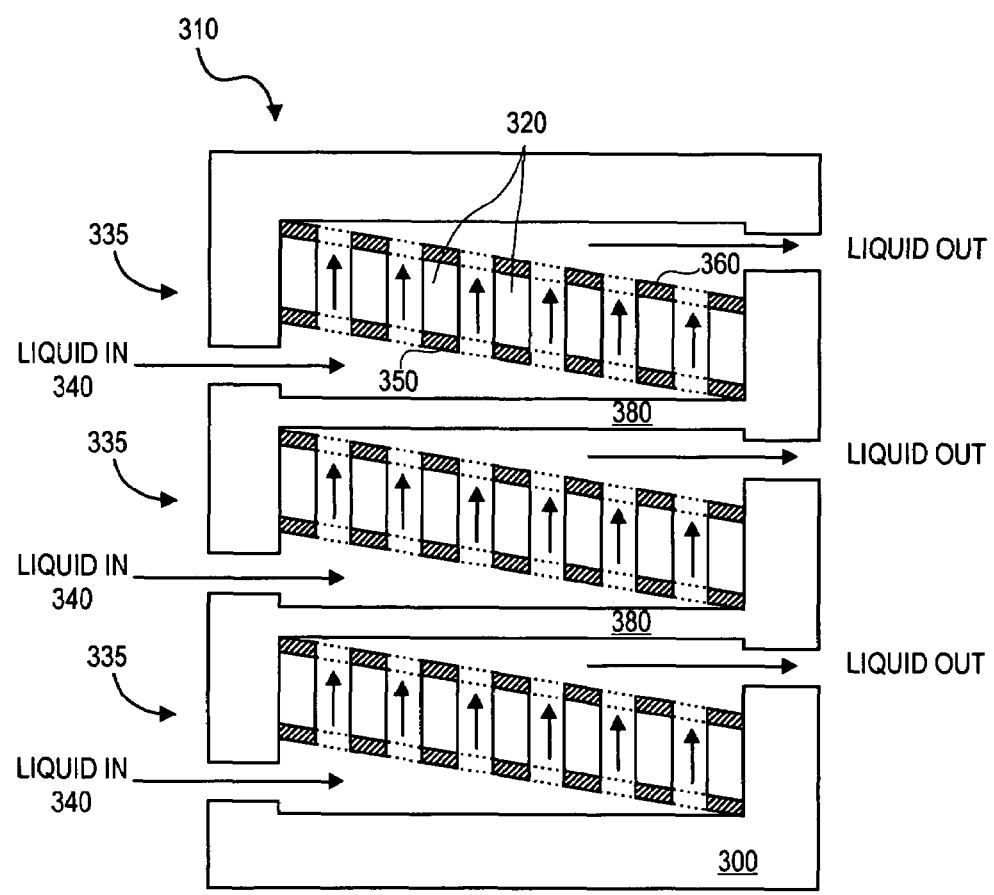
FIG. 3c is an illustration of an overhead view of an electroosmotic pump having more than one row of trenches.

In an embodiment, as illustrated in FIG. 3c, more than one row 335 of trenches 320 may be formed to form many electroosmotic pumps 310. The number of rows 335 may be in the approximate range of between 20 to 1000, and the number of trenches 320 per row 335 may be in the approximate range between 100 trenches and 2000 trenches. Based on these ranges of rows 335 and trenches 320, the total number of trenches 320 in the flow region 325 may be between 40,000 trenches and 100,000 trenches. The rows 335 may be formed in a variety of patterns relative to one another, and the patterns may be selected based upon a variety of reasons, such as, for example, to obtain maximum flow output in a minimum substrate area. In one embodiment, the pattern of the rows 335 of trenches 320 may be based on regions where hot spots are likely to form in the substrate 300. In an embodiment where more than one row of trenches 335 if formed on a substrate, the electroosmotic pumps 310 may be divided by dividers 380. The dividers 380 prevent the fluid from one pump row from flowing into an adjoining pump row. In other words, the pumps 310 may be set up so that the pumps 310 are in parallel. In this embodiment, the cooling liquid 340 flows into the electroosmotic pump 310, through the trenches 320 from the first electrode (anode) 350 to the second electrode (cathode) 360, and then out of the electroosmotic pump 310.

Figure 4A:
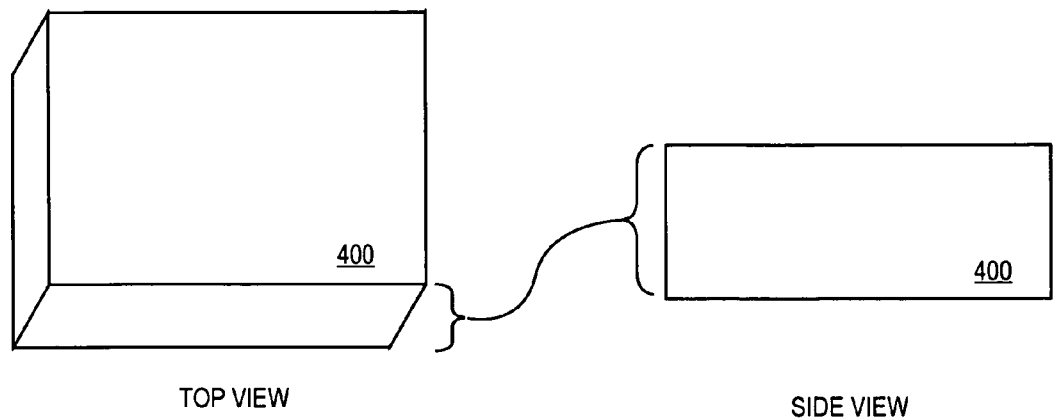
FIGS. 4a–4j are illustrations of a method of fabricating an electroosmotic pump having electrodes formed over trenches.
Figure 4B:
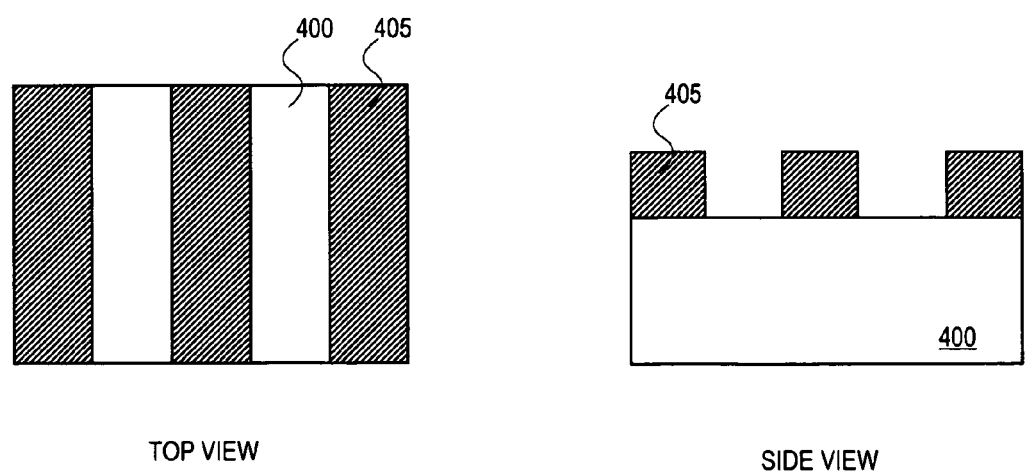
Figure 4C:
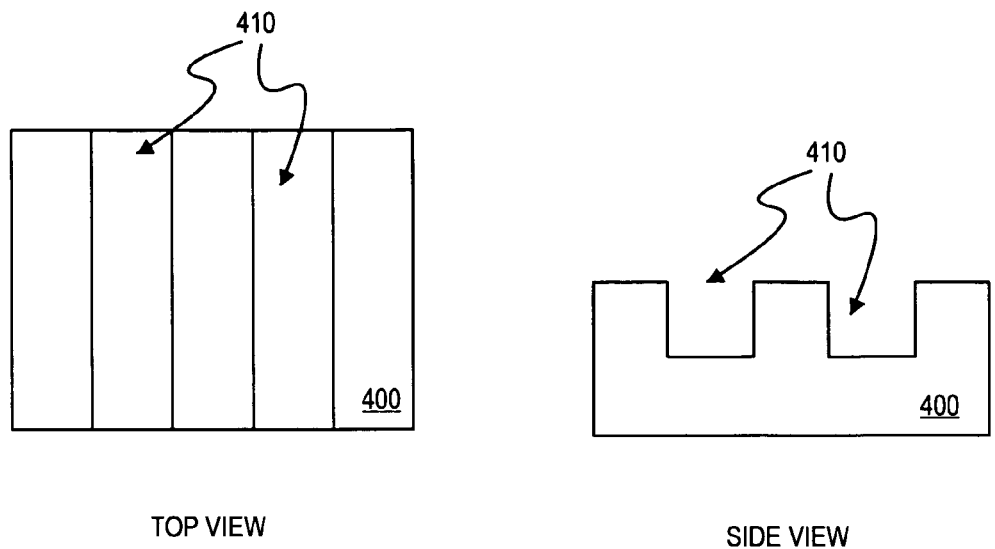
Figure 4D:
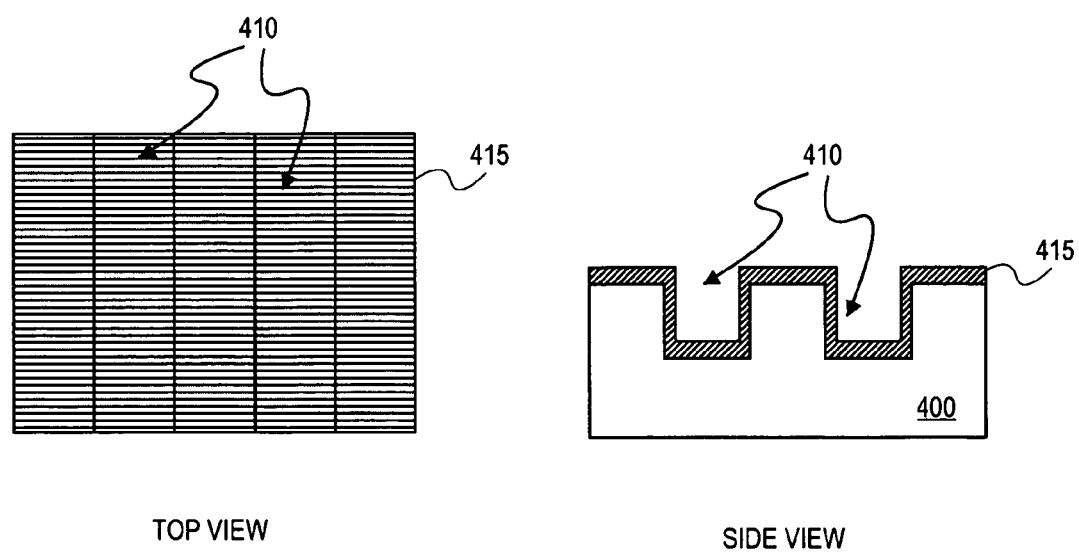

FIGS. 4a–4j illustrate an embodiment of a method of forming a pair of electrodes over a row of trenches for an electroosmotic pump. In FIG. 4a a substrate 400 is provided. The substrate 400 may be a semiconductor material such as silicon, or the substrate 400 may be formed from other materials such as glass and quartz. In FIG. 4b a first resist 405 is patterned over the substrate 400 to create a pattern for etching trenches 410 (illustrated in FIG. 4c) into the substrate 400. The substrate 400 may then be etched to form trenches 410 as illustrated in FIG. 4c. In one embodiment the substrate is etched with an anisotropic dry etch. In an embodiment illustrated in FIG. 4d a liner layer 415 may be deposited over the substrate 400 and the trenches 410. The purpose of the liner layer 415 is to prevent electrical leakage currents through the substrate 400, if for example the substrate 400 is a semiconductor material. The liner layer 415 may be deposited, for example, by thermal growth or by chemical vapor deposition. In one embodiment the liner layer 415 may be an insulator such as silicon oxide or silicon nitride. In an alternate embodiment the liner layer 415 is deposited by first: forming a silicon nitride layer over the substrate 400. Over the silicon nitride layer, a polysilicon layer is formed. The polysilicon layer is then oxidized to form a silicon oxide layer over the silicon nitride layer. The combination of the silicon nitride layer and the silicon oxide layer, in this embodiment, is the liner material 415. The combination of silicon nitride and silicon oxide is used because thermally grown silicon oxide alone may have pinholes that may result in electrical shorts through a semiconductor substrate. A silicon nitride layer does not have this problem, however, it does not pump as well as silicon oxide. Therefore, by having silicon oxide layer on top of a silicon nitride layer, the shorts may be eliminated and the pump may operate better.

Figure 4E:
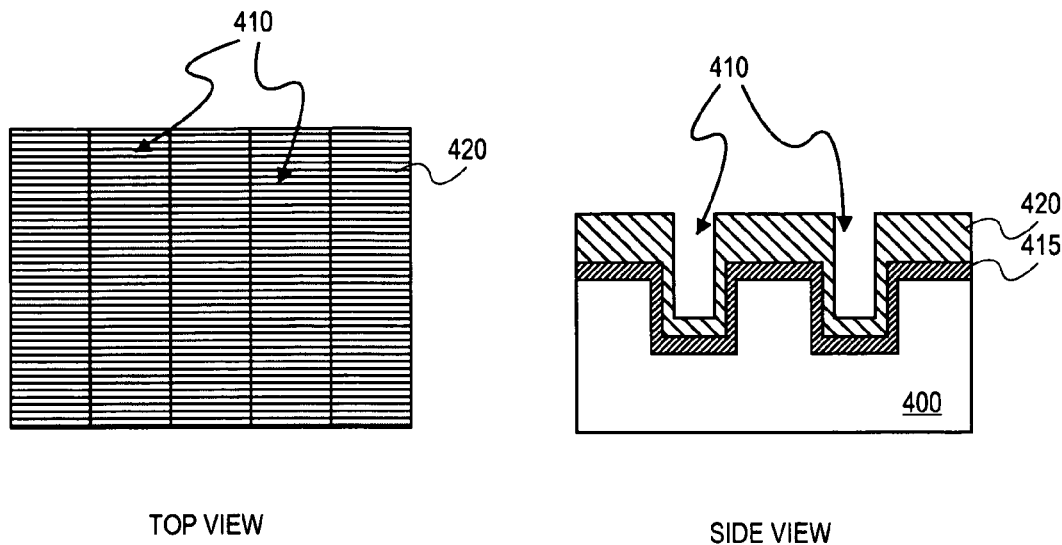
Figure 4F:
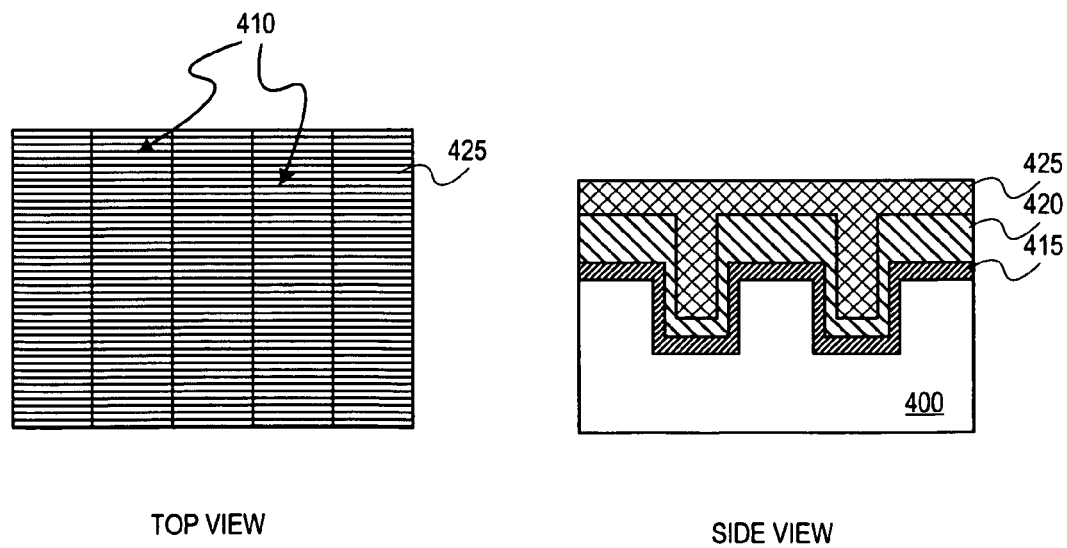
Figure 4G:
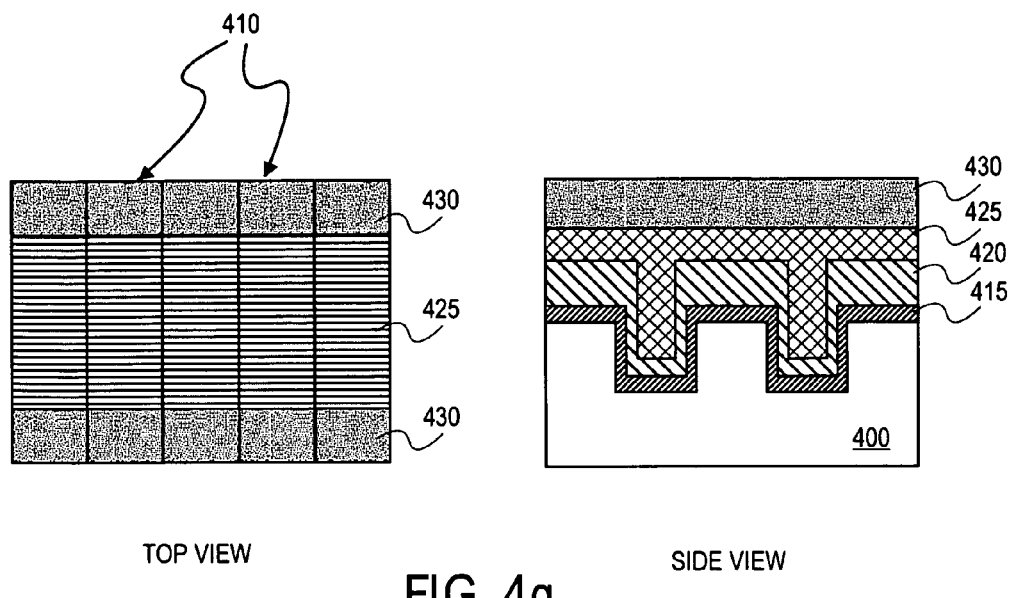
Figure 4H:
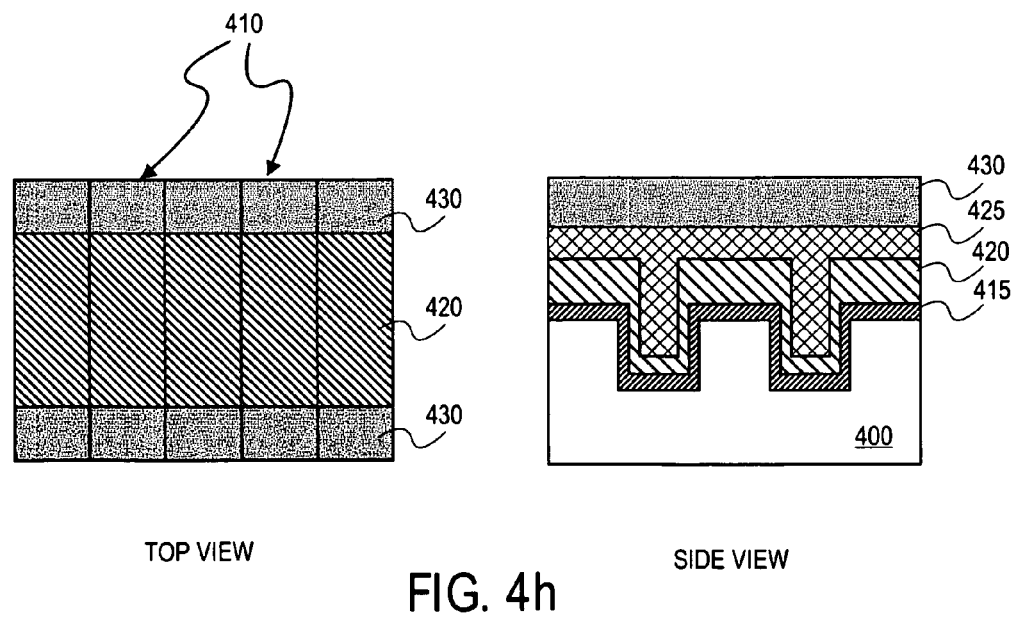

FIG. 4e illustrates the deposition of a conductive layer 420 over the liner layer 415. The conductive layer 420 may be a metal such as platinum, or in the alternative the conductive layer 420 may be graphite. In one embodiment, the conductive layer 420 is platinum and may be deposited by sputtering, chemical vapor deposition, or electroplating. In an embodiment, where electroplating is used to deposit the conductive layer 420, a base layer of metal that may be electrified for the electrodeposition may be formed by chemical vapor deposition. After formation, the conductive layer 420 may be covered with a layer of sacrificial light absorbing material, SLAM™, from Honeywell Corp., layer 425, as illustrated in FIG. 4f. The SLAM™ layer 425 is optional in the process of forming the trenches 410 and electrodes for an electroosmotic pump, but it is valuable to use because it may provide a uniformly flat surface for the subsequent etching of the conductive layer 420. This aids in the subsequent resist patterning process. The SLAM™ layer 425 may be spun on the conductive layer 420. The SLAM™ material is formulated to fill in high aspect ratio features such as the trenches that will form the electroosmotic pump. In FIG. 4g a second resist 430 is patterned over the SLAM™ layer 425, or in the alternative, directly over the conductive layer 420, to define the position of a pair of electrodes over the trenches 410. The second resist 430 may be deposited by spraying, extruding, or by a spin on technique. Another benefit of the SLAM™ material is that it is "tuned" to absorb light at the wavelength that is used to expose the resist 430. This aids in the resist patterning process. As illustrated in FIG. 4h, an etch, such as dry anisotropic etch, may then be used to remove the exposed SLAM™ 425, if a SLAM™ 425 layer is used, and to stop on the conductive layer 420. If a SLAM™ layer 425 is not used, the etch to remove the SLAM™ layer 425 is not necessary.

Figure 4I:
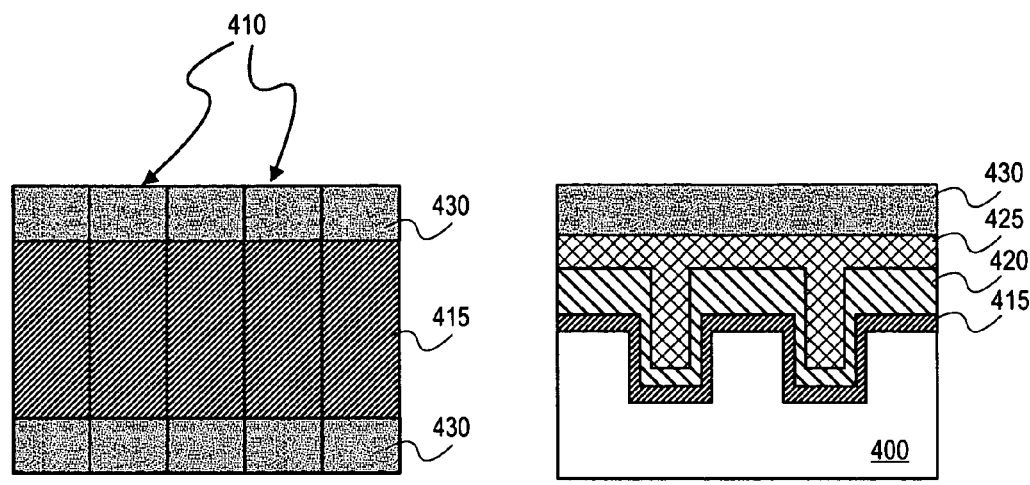
Figure 4J:
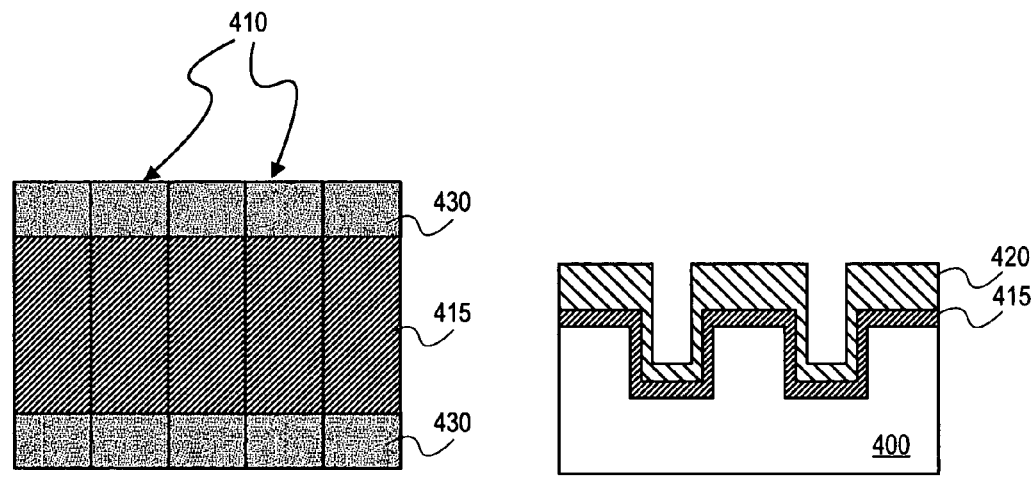

Next, in FIG. 4i the exposed conductive layer 420 that is not covered by the second resist 430 is removed by an etch. The etch used to remove the exposed conductive layer 420 may be an isotropic wet or dry etch. Any sort of wet etch solution or plasma etch that may etch the conductive layer 420 but not the resist may be used. After the conductive layer 420 has been patterned, the remaining resist 430 and the SLAM™ layer 425 may be removed by an ash followed by a solvent stripping to expose the conductive layer 420. Through the methods described above, electrodes may be formed close to one another, aligned with the trenches 410 at approximately a 90 degree angle, and placed within the flow regions (the trenches) of an electroosmotic pump. The conductive layer 420 may be patterned to cover a percentage of the flow region that is not so small or so large as to prevent the creation of flow. The rate at which a cooling liquid may flow through the trenches may therefore be increased. The electrodes may be attached to electrical leads (not shown) that may contact the electrodes from above the electrodes, or from below the electrodes and through the substrate 400. The methods described above are also valuable in that the formation of electroosmotic pumps on a substrate may be easily integrated into semiconductor fabrication techniques already used. In addition, by forming the electrodes directly on high aspect ratio trenches, the electroosmotic pumps may be very small so that multiple trenches 410 and rows of trenches 410 may be formed on one substrate and integrated into small devices such as cell phones or lap top computers.

Figure 5:
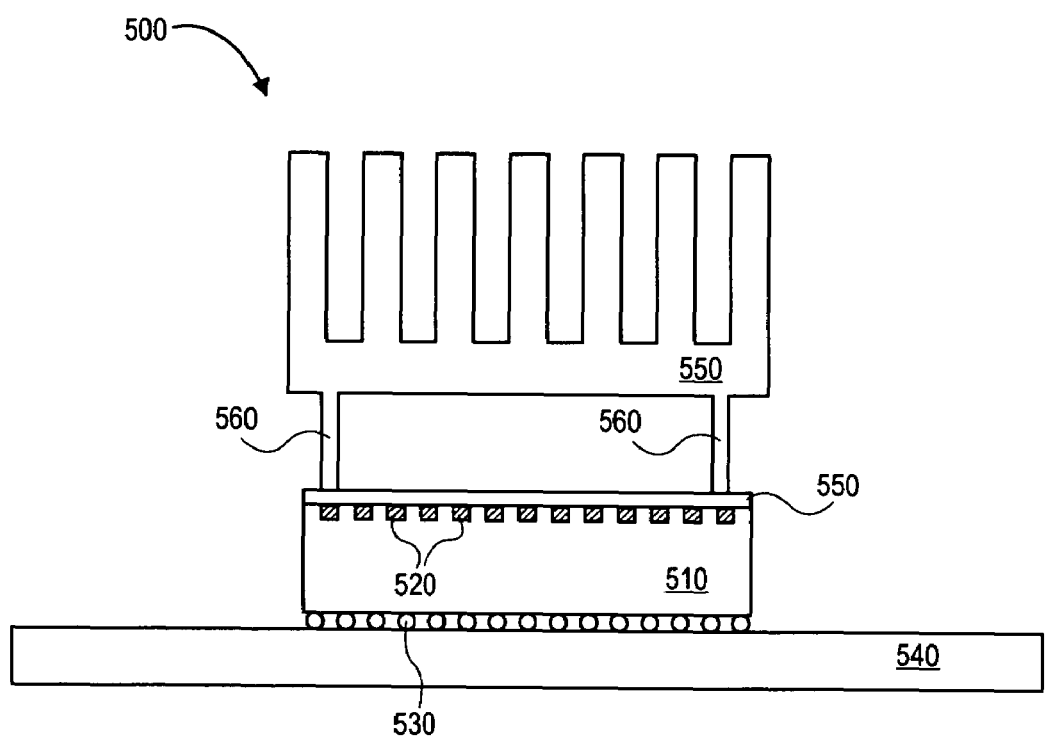
FIG. 5 is an illustration of a microelectronic package having electroosmotic pumps formed on the backside of a die.

An electroosmotic pump having electrodes formed over the row or rows of trenches by the above processes may become part of a microelectronic package. In one embodiment illustrated in FIG. 5 the electroosmotic pump may be part of a die 510 of a microelectronic package 500. The trenches 520 of the electroosmotic pumps may be formed on the backside of the die 510 opposite to the side of the die 510 on which the semiconductor devices may be formed. Cooling liquid may be flowed through the trenches and across the backside of the die 510 through microchannels to remove heat during operation of the devices formed on the frontside of the die 510. The die 510 may be connected by contacts 530 formed of C4 or solder to a package substrate 540. Above the die 510 a radiator 550 may be connected to the die 510 by pipes 560. In alternate embodiments the radiator 550 may be positioned away from the die 510 either on the package substrate 540 or external to the package substrate 540. After flowing through the trenches 520 of the electroosmotic pumps and microchannels, the cooling liquid may flow through the pipes 560 into the radiator 550 to cool down before being recirculated into the trenches 520 of the electroomostic pumps.

Figure 6:
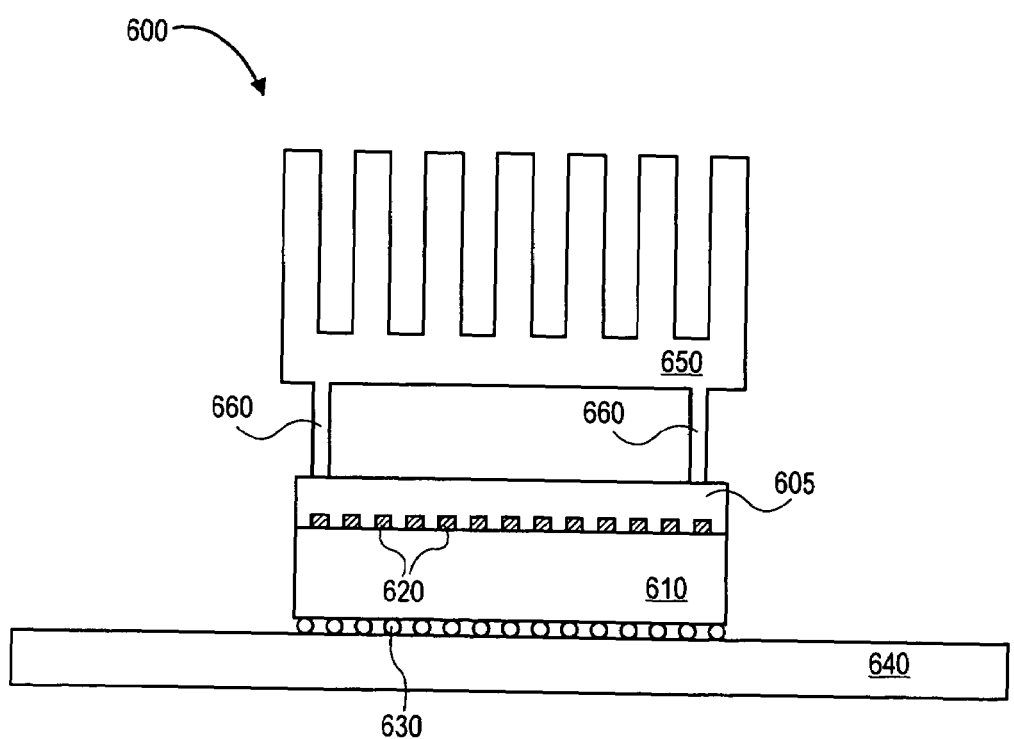
FIG. 6 is an illustration of a microelectronic package having electroosmotic pumps formed on a thermal management chip that is placed in contact with a die.

In an alternate embodiment the electroosmotic pumps that are part of a microelectronic package 600 may be formed on a thermal management chip 605, as illustrated in FIG. 6. Trenches 620 may be formed on the thermal management chip 605 to form the electroosmotic pumps that will create flow in a cooling liquid and drive that cooling liquid through microchannels which are also contained on the thermal management chip to cool an object that is placed into contact with the thermal management chip 605. The thermal management chip 605 may be placed in direct contact with the backside of the die 610 to remove heat from the die 610. It is valuable to note that while the electroosmotic pump may not be in contact with the hot areas on the back of the die, the microchannels formed in the thermal management chip may be in contact with the hot areas on the back of the die. The die 610 may be connected by solder bumps 630 to a package substrate 640. Above the die 610 a radiator 650 may be connected to the electroosmotic pumps of the thermal management chip 605 by pipes 660. In alternate embodiments the radiator 650 may be positioned away from the die 610 either on the package substrate 640 or external to the package substrate 640. After flowing through the trenches 620 of the electroosmotic pumps, the cooling liquid may flow through microchannels which are in contact with the back of the die and then the pipes 660 into the radiator 650 to cool down before being recirculated into the trenches 620 of the electroomostic pumps.

Several embodiments of the invention have thus been described. However, those of ordinary skill in the art will recognize that the invention is not limited to the embodiments described, but can be practiced with modification and alteration within the scope and spirit of the appended claims that follow.

We claim:

1. A process, comprising:
   providing a substrate;
   etching at least one trench into the substrate, the at least one trench having a pair of walls and a bottom;

forming a first electrode within the trench of an electroosmotic pump over the pair of walls and the bottom; and forming a second electrode within the trench of the electroosmotic pump over the pair of walls and the bottom, wherein the second electrode is formed adjacent to but electrically separate from the first electrode.

2. The process of claim 1, wherein the first electrode is parallel to the second electrode.

3. The process of claim 1, wherein the at least one trench has a length and a width and wherein the first electrode and the second electrode are at approximately a 90° angle to the length of the at least one trench.

4. The process of claim 1, further comprising forming an insulator liner layer above the semiconductor substrate before forming the first and second electrodes.

5. The process of claim 4, wherein forming an insulator liner layer comprises: depositing a silicon nitride layer;

depositing a polysilicon layer above the silicon nitride layer; and oxidizing the polysilicon layer to form a silicon oxide layer.

6. The process of claim 1, wherein forming the first electrode and forming the second electrode comprises:

depositing a conductive layer within the at least one trench over the pair of walls and the bottom;

patterning a resist above the conductive layer; and etching the conductive layer.

7. The process of claim 6, further comprising depositing a sacrificial light absorbing material comprising SLAM™ above the conductive layer before patterning the resist above the conductive layer.

8. The process of claim 1, wherein etching an at least one trench comprises etching a plurality of trenches and a plurality of rows of the plurality of trenches into the substrate.

9. The process of claim 1, wherein the substrate is a silicon die.

10. The process of claim 1, wherein the first electrode and the second electrode are platinum.

11. A process, comprising:

etching a plurality of parallel trenches into a silicon substrate, the trenches each having a contour of a pair of walls and a bottom;

forming an oxide liner layer along the contour of the trenches;

depositing a platinum film over the oxide liner layer along the contour of the trenches;

patterning the platinum film, wherein patterning the platinum film comprises depositing a sacrificial light absorbing material comprising SLAM™ above the platinum film, patterning a resist above the SLAM™, and etching the SLAM™ not covered by the resist; and etching the platinum film with an isotropic etch to form a pair of electrodes over the contour of the trenches.

12. The process of claim 11, wherein trenches are separated by a distance in an approximate range of 5 um to 50 um.

13. The process of claim 11, wherein the plurality of parallel trenches each have a high aspect ratio of height to width in the approximate range of 10:1 and 100:1.

14. A process, comprising:

providing a trench having a pair of walls and a bottom into a substrate, the trench having a first electrode formed within the trench over a portion of the pair of walls and the bottom of the trench and a second electrode formed within the trench over a portion of the pair of walls and the bottom of the trench, the second electrode separate from the first electrode by a distance; and maximizing a flow rate of a liquid in the trench by increasing an electric field created by the first electrode and the second electrode across the trench by minimizing the distance between the first electrode and the second electrode.

15. The process of claim 14, wherein the flow rate is in the approximate range of 1 ml/s and 50 ml/s.

16. The process of claim 14, further comprising applying a voltage to the first electrode, and wherein the second electrode is grounded.

* * * * *